United States Patent [19]

Amedeo

[11] Patent Number: 5,089,722
[45] Date of Patent: Feb. 18, 1992

[54] HIGH SPEED OUTPUT BUFFER CIRCUIT WITH OVERLAP CURRENT CONTROL

[75] Inventor: Robert J. Amedeo, Austin, Tex.

[73] Assignee: Motorola, Inc., Schaumburg, Ill.

[21] Appl. No.: 503,012

[22] Filed: Apr. 2, 1990

[51] Int. Cl.[5] .................. H03K 17/16; H03K 19/094; H03K 5/12; H03K 17/687

[52] U.S. Cl. .................... 307/443; 307/451; 307/542; 307/475; 307/548; 307/558; 307/263

[58] Field of Search ............. 307/270, 443, 542, 572, 307/448, 451, 452, 585, 552, 555, 558, 568, 592, 594, 597, 246, 263, 242, 475, 547, 548

[56] References Cited

U.S. PATENT DOCUMENTS

| | | | |
|---|---|---|---|
| 4,772,812 | 9/1988 | Desmarais | 307/270 X |
| 4,820,942 | 4/1989 | Chan | 307/542 |
| 4,885,485 | 12/1989 | Leake et al. | 307/542 |
| 4,908,528 | 3/1990 | Huang | 307/542 X |
| 4,918,339 | 4/1990 | Shigeo et al. | 307/542 |
| 4,954,729 | 9/1990 | Urai | 307/263 X |
| 4,959,565 | 9/1990 | Knecht et al. | 307/542 |
| 4,961,010 | 10/1990 | Davis | 307/542 X |

*Primary Examiner*—Edward P. Westin
*Assistant Examiner*—David R. Bertelson
*Attorney, Agent, or Firm*—Robert L. King

[57] ABSTRACT

A pre-driver stage includes two pairs of series-stacked transistors for responding to input stage outputs and provides first and second outputs to an output driver stage. The first output becomes low at a certain delay period after the second output becomes low, and the second output becomes high at a certain delay period after the first output becomes high. Therefore, the turn-off of the active driver transistor is completed before the turn-on of the opposite output transistor, inhibiting an overlap current. In another form, the buffer circuit also uses assist transistors placed near the driver transistors for assisting the opposite driver transistors in turning off.

14 Claims, 4 Drawing Sheets

HIGH SPEED OUTPUT BUFFER CIRCUIT WITH OVERLAP CURRENT CONTROL

FIELD OF THE INVENTION

The present invention relates, in general, to an output buffer circuit. More particularly, the invention relates to a CMOS (complementary metal-oxide-silicon) output buffer circuit with high speed switching and large power handling capacity.

BACKGROUND OF THE INVENTION

Many digital output or driver circuits have been developed for use in MOS FET(field effect transistor) integrated circuitry, especially for use at output pads (terminals) of microprocessors or microcomputers. A CMOS output buffer having a complementary pair of transistors in an output stage is widely used and operates at a relatively high speed and reduces the internal power consumption when the buffer is in one or the other of its two logic states. However, the basic CMOS output buffer has a disadvantage that an overlapping current passes through the P-channel and N-channel transistor of the output stage in the buffer when it is switching from one logic state to the other.

In addition, it is desirable that the conventional buffer circuit be able to source (and sink) a large amount of current to (and from) external circuitry connected thereto. But, it is difficult to drive external large circuit loads by the conventional CMOS output buffer.

Attempts to overcome such defects of the single transistor pair CMOS output buffer include cross-coupling pre-drivers with input logic gates to provide propagation delays. Others have also connected multiple complementary transistor pairs in parallel in an output stage to increase the source and sink currents. However, such cross-coupling buffer circuits require additional interconnections which undesirably increase the complexity of the circuit, and the propagation delay period of the circuit cannot be controlled. Further, the multiple complementary transistor pair output buffer worsens the overlapping current problem, as described below in detail.

SUMMARY OF THE INVENTION

Accordingly, it is an object of the present invention to provide an improved output buffer circuit which has high switching speed with overlap current control.

More particularly, it is an object of the present invention to provide an improved output buffer circuit having large power driving capacity with overlap current control.

Yet another object of the present invention is to provide an improved output buffer circuit which can be easily implemented into existing circuits without additional process steps or area.

In carrying out the above and other objects of the invention there is provided, in one form, an output buffer circuit having a data input terminal for receiving a data signal, and an output signal terminal for providing an output signal. The output buffer circuit comprises an input stage, a pre-driver stage, and an output driver stage having a pair of driver transistors connected in series. The pre-driver stage includes two pairs of stacked transistors for responding to the input stage outputs and provides first and second outputs to the output driver stage. The first output assumes a first logic state after a first predetermined controlled delay period after the second output assumes the first logic state, and the second output assumes a second logic state after a second predetermined controlled delay period after the first output assumes the second logic state. The turn-off of an active driver transistor in the driver stage is completed before the turn-on of a second driver transistor in the driver state, thereby preventing an overlap current.

According to another feature of the invention, the output buffer circuit further comprises assist semiconductor devices placed near the corresponding driver transistors for assisting the driver transistors in turning off.

These and other objects, features, and advantages, will be more clearly understood from the detailed description below together with the accompanying drawings.

DETAILED DESCRIPTION OF THE INVENTION

As mentioned before, although a conventional basic CMOS output buffer has the advantage of low quiescent current, it also has a disadvantage of an overlap current when switching between logic states. First, a brief reference will be made to a basic CMOS output buffer.

Figure 1A:
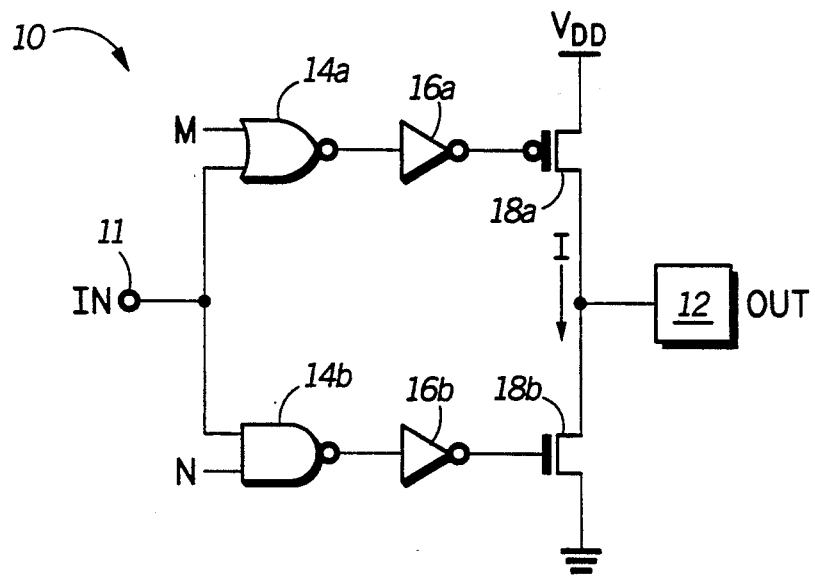
FIG. 1A is a partial schematic diagram of a known output buffer circuit having a basic CMOS driver.

FIG. 1A schematically shows an example of a known CMOS output buffer. As shown in FIG. 1A, a basic output buffer circuit 10 includes a data input terminal 11 for receiving a data logic signal IN, and an output signal terminal 12 for providing an output logic signal OUT to external circuitry (not shown). When buffer 10 is receiving a logically high signal at terminal 11, the logic high signal is applied to a first input of a NOR gate 14a, thereby causing NOR gate 14a to provide a logic low signal on its output lead which is connected to the input of an inverter 16a. The logic state of an enable signal M connected to a second input of NOR gate 14a is assumed to be a logic low. Inverter 16a supplies at an output a logic high output signal which is applied to the gate of a P-channel MOS (metal-oxide-silicon) FET (field effect transistor) 18a, thus making P-channel transistor 18a nonconductive.

Simultaneously, the logic high signal at input terminal 11 is applied also to a first input of a NAND gate 14b with a second input receiving a logic high enable signal N, thereby causing NAND gate 14b to provide a logic low signal at its output which is connected to the input of an inverter 16b. Inverter 16b supplies on its output a logic high output signal which is applied to the gate of an N-channel MOS transistor 18b, thus making N-channel transistor 18b conductive.

In this way, with buffer 10 receiving a logic high data signal, P-channel transistor 18a is off (nonconductive) and N-channel transistor 18b is on (conductive), thus effectively connecting output signal terminal 12 to ground through N-channel transistor 18b and disconnecting output signal terminal 12 from the positive supply voltage $V_{DD}$. Therefore, a logic low output signal is provided and buffer 10 is allowed to sink current from external circuitry (not shown) connected to terminal 12.

Conversely, when buffer 10 is receiving a logic low input signal, the logic low input signal is applied to the first input of NOR gate 14a with the second input thereof receiving a logic low enable signal M, thereby causing NOR gate 14a to provide a logic high signal at its output which is connected to the input of inverter 16a. Inverter 16a supplies at its output a logic low output signal which in turn is applied to the gate of P-channel transistor 18a, thus making P-channel transistor 18a conductive.

Simultaneously, the logic low signal at input terminal 11 is applied also to the first input of NAND gate 14b with the second input thereof still receiving a logic high enable signal N, thereby causing NAND gate 14b to provide a logic high at its output which is connected to the input of inverter 16b. Inverter 16b supplies at its output logic low output signal which in turn is applied to the gate of N-channel transistor 18b, thus making N-channel transistor 18b nonconductive.

In this manner, with buffer 10 receiving a logic low data signal, output signal terminal 12 is effectively connected to positive supply voltage $V_{DD}$ and is disconnected from ground, therefore providing a logic high output signal and allowing buffer 10 to source current to external circuitry (not shown).

Figure 2:
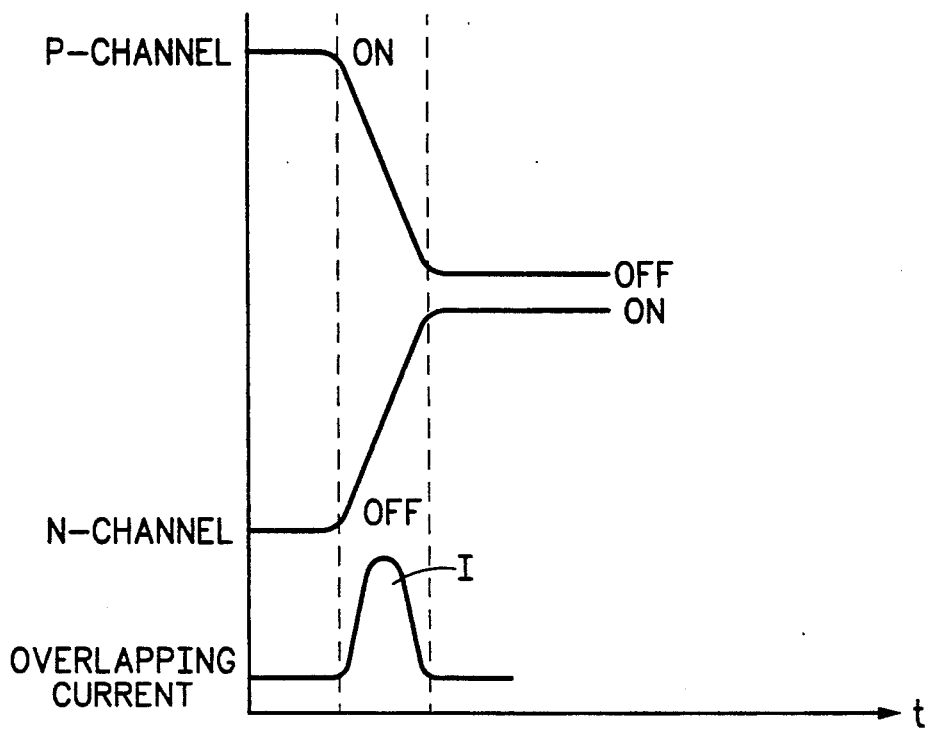
FIG. 2 is a graph illustrating the generation of an overlap current in an output driver.

However, in this basic CMOS output buffer 10, because each signal from inverters 16a and 16b respectively arrives at the gates of transistors 18a and 18b simultaneously, P-channel transistor 18a turns off and N-channel transistor 18b turns on at the same time, as shown by a graph in FIG. 2, and vice versa. That is, the period of transient logic state of transistor 18a overlaps with the transient period of transistor 18b. Therefore, during the transient periods of transistors 18a and 18b, a current I passes from supply voltage $V_{DD}$ through transistors 18a and 18b to ground. This overlap current (sometimes called "spike current") is especially high in a large output buffer having high power driving capability. The overlap current I is undesirable because it increases internal current consumption and causes RFI (radio frequency interference) which adversely affects other circuitry.

Figure 3:
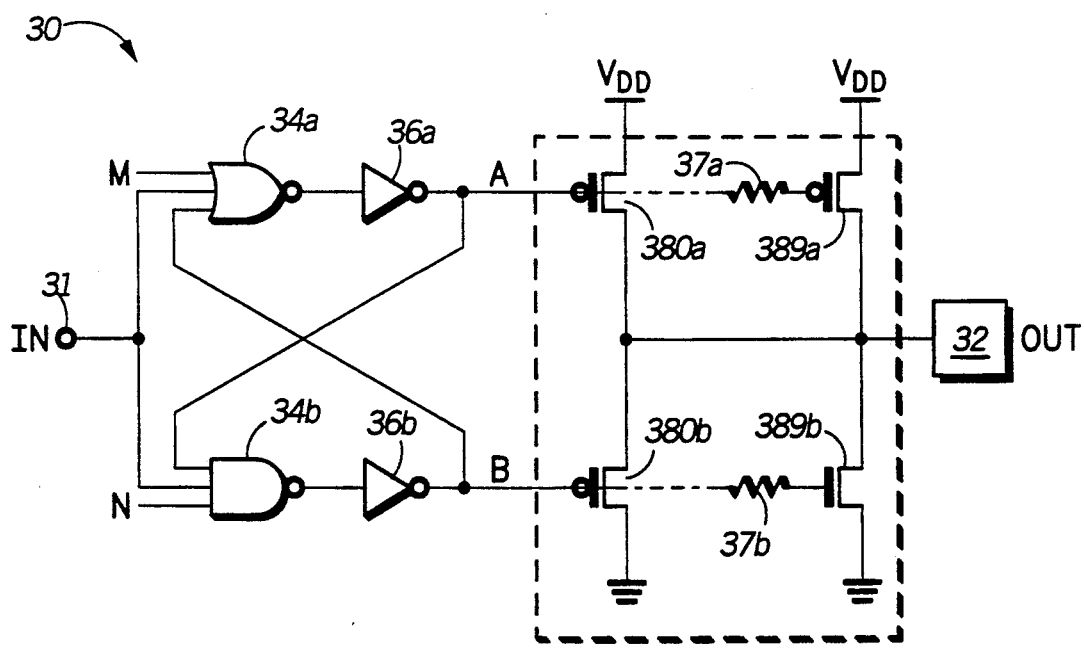
FIG. 3 is a partial schematic diagram of another known output buffer circuit having a cross-coupling structure.

FIG. 3 shows another example of another known output buffer designed to solve the overlap current problem. As shown in FIG. 3, a cross-coupled output buffer circuit 30 includes a data input terminal 31 for receiving a digital data input signal IN, and an output signal terminal 32 for providing an output signal OUT to external circuitry (not shown). Output buffer 30 also includes a predetermined number of pairs of P-and N-channel MOS transistors 380a, b through 389a, b as noted by the dashed lines. Input terminal 31 is connected to a first input of a NOR gate 34a and to a first input of a NAND gate 34b. The output of each of NOR gate 34a and NAND gate 34b is connected to an input of inverters 36a and 36b, respectively. Output signals A and B from inverters 36a and 36b, respectively, are applied to the gates of multiple P-channel and N-channel transistors 380a through 389a and 380b through 389b, respectively. The circuit structure of cross-coupled buffer 30 is almost the same as that of CMOS buffer 10 shown in FIG. 1A, except that the output leads of inverters 36a and 36b are cross-coupled to other inputs of the NAND gate 34b and NOR gate 34a respectively, as shown in FIG. 3.

When buffer 30 is receiving a logic high data input signal, P-channel transistors 380-9a are off and N-channel transistors 380-9b are on, thus effectively connecting output signal terminal 32 to ground through N-channel transistors 380-9b and disconnecting output signal terminal 32 from a positive supply voltage $V_{DD}$. Therefore a logic low output signal is provided and buffer 30 is allowed to sink a large amount of current from external circuitry (not shown) connected to terminal 32.

Conversely, when buffer 30 is receiving a logic low data input signal, output signal terminal 32 is effectively connected to positive supply voltage $V_{DD}$ and is disconnected from ground, therefore providing a logic high output signal and allowing buffer 10 to source a large amount of current to the external circuitry.

When the data input signal IN changes from one logic state to the other, the transient behaviors of output signals A and B respectively from inverters 36a, 36b are different from the outputs of inverters 16a and 16b of buffer 10 shown in FIG. 1A.

When the data input signal IN changes from logic high to logic low, the output of NAND gate 34b changes from low to high after one NAND gate delay. Then output signal B of inverter 36b changes from high to low after one inverter delay, and thereafter turns off each of N-channel transistors 380-9b. On the other hand, when data input signal IN changes from high to low, all inputs of NOR gate 34a do not change to low at once. A cross-coupled second input of NOR gate 34a which is provided with output signal B by inverter 36b slowly changes to low after one NAND gate and one inverter gate delay. After that, output signal A of inverter 36a changes to low after one NOR gate and one inverter gate delay, and then turns on P-channel transistors 380-9a. Therefore, the turn-on of P-channel transistor 380a is delayed after the turn-off of N-channel transistor 380b by one NOR gate and one inverter gate delay period, thereby inhibiting overlap current.

Conversely, when data input signal IN changes from low to high, the turn-on of N-channel transistor 380b is delayed after the turn-off of P-channel transistor 380a by one NAND gate and one inverter gate delay period, to inhibit overlap current.

However, this cross-coupled output buffer 30 also has disadvantages. The delay period resulting from the cross-coupling is too long due to plural transistor feedback gates (explained below in more detail), and cannot be accurately controlled.

In the case where multiple complementary transistor pairs 380-9a, b are employed, the last transistors 389a, b turn off much later, because parasitic impedance such as resistances 37a, b exist between the gate of the first transistor 380a, b and the gate of the last transistor 389a, b. The parasitic impedance typcially results, in part, from the nature of the physical layout implementation of buffer 30 which is often required to comply with certain rules, in part, to control the conventional and well documented di/dt problem. Due to the delay of the turn-off of the last transistors 389a, b, electrical currents pass, for example, through P-channel transistor 389a and N-channel transistor 380b during the transient periods. Accordingly, in order to eliminate such cross-flowing overlap currents, more delay of the turn-on of the transistors is required and therefore more transistors are needed to accomplish the more delay. However these transistors are expensive and difficult to install, and their delay can not be adequately controlled.

Figure 1B:
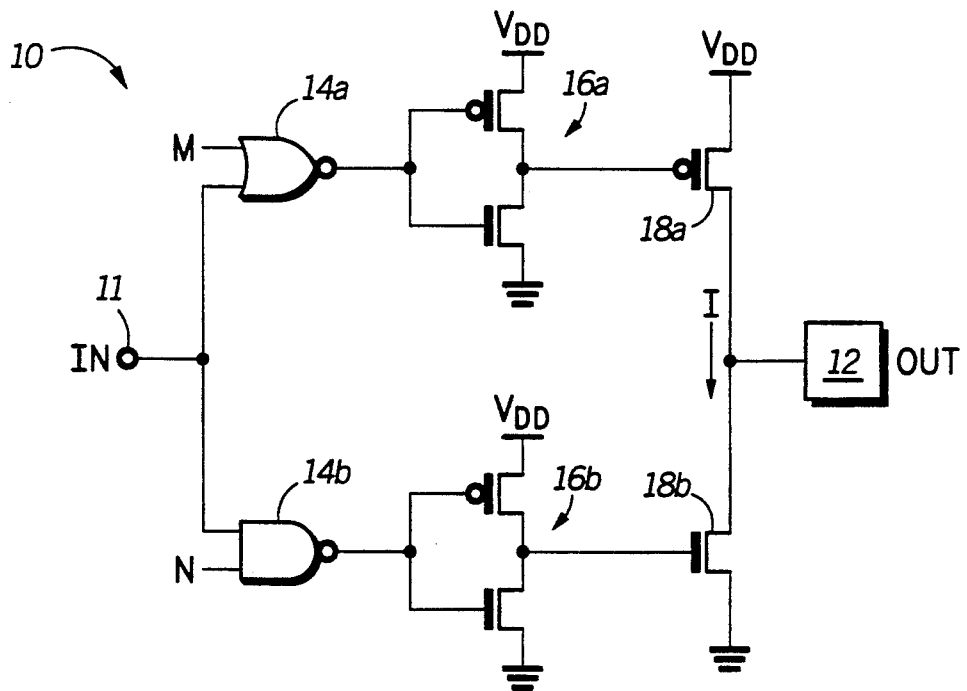
FIG. 1B shows the circuit of FIG. 1A, illustrating the inverters schematically.
Figure 4A:
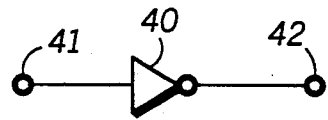
FIGS. 4A and 4B show, respectively, the symbol of an inverter and its schematic diagram when implemented utilizing MOS transistors.
Figure 4B:
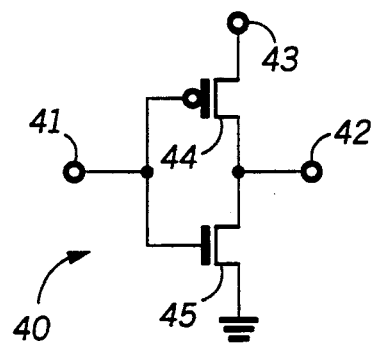

Now, reference will be made to the inside structures of an inverter, a NAND gate and a NOR gate. An inverter, such as inverters 16a, b shown in FIG. 1A, is comprised of two MOS transistors as shown in FIGS. 4A and 4B. FIG. 4A shows the symbol for an inverter 40 having an input terminal 41 and an output terminal 42. FIG. 4B shows the MOS transistor implementation of the inverter 40. As shown in FIG. 4B, inverter 40, again having input terminal 41 and output terminal 42, is constructed by suitably connecting a P-channel MOS transistor 44 and an N-channel MOS transistor 45, with a terminal 43 being connected to a positive supply voltage. Thus, inverter 40 requires two MOS transistors. Therefore it should be understood that the circuit of FIG. 1B is equivalent to buffer circuit 10 shown in FIG. 1A.

Figure 5A:
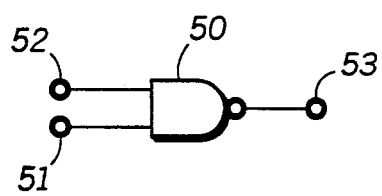
FIGS. 5A and 5B show, respectively, the symbol for a NAND gate and its schematic diagram utilizing MOS transistors.
Figure 5B:
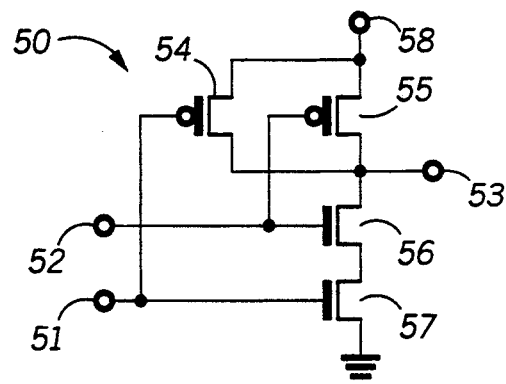
Figure 6A:
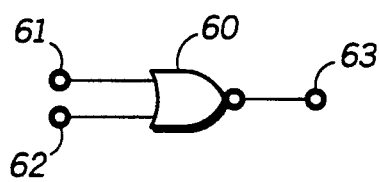
FIGS. 6A and 6B show, respectively, the symbol for a NOR gate and its schematic diagram utilizing MOS transistors.
Figure 6B:
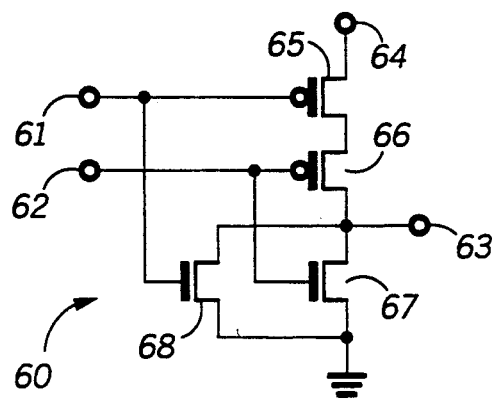

Similarly, a three-input NAND gate, such as NAND gate 34b of FIG. 3, requires six MOS transistors. A two-input NAND gate requires four transistors. As shown in FIGS. 5A and 5B, NAND gate 50, having inputs 51 and 52 and an output 53, is constructed utilizing P-channel MOS transistors 54 and 55, and N-channel MOS transistors 56 and 57, with a terminal 58 being connected to a positive supply voltage. Furthermore, a three-input NOR gate, such as NOR gate 34a of FIG. 3, requires at a minimum four MOS transistors. As shown in FIGS. 6A and 6B, two-input NOR gate 60, having inputs 61 and 62 and an output 63, is constructed utilizing P-channel MOS transistors 65 and 66, and N-channel MOS transistors 67 and 68.

Accordingly it should be understood that the propagation delay of NOR gate 34a of FIG. 3 is equal to two transistor gate delays when its output changes low to high. And it also should be understood that the propagation delay of NAND gate 34b of FIG. 3 is equal to two transistor gate delays when its output changes high to low.

In FIG. 3, when data input signal IN changes high to low, the turn-on of P-channel transistor 380a is delayed after the turn-off of N-channel transistor 380b by three transistor gate delay periods, which is too long and uncontrollable. Conversely, when data input signal IN changes from low to high, the turn-on of N-channel transistor 380b is delayed after the turn-off of P-channel transistor 380a by three transistor gate delay periods, which is also too long and uncontrollable.

Figure 7:
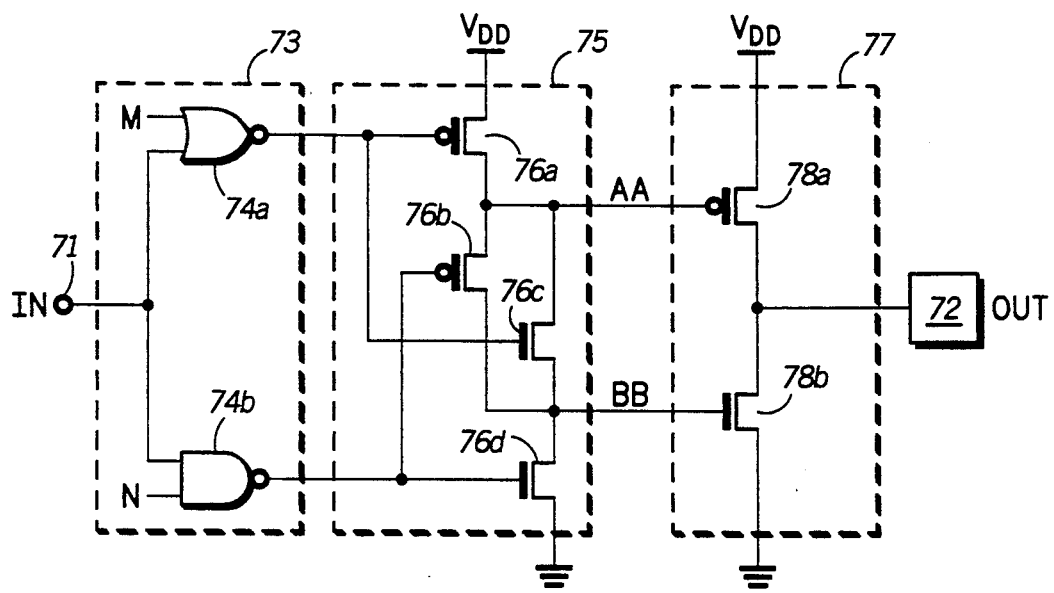
FIG. 7 is a schematic diagram of one embodiment of an output buffer circuit of this invention.
Figure 8:
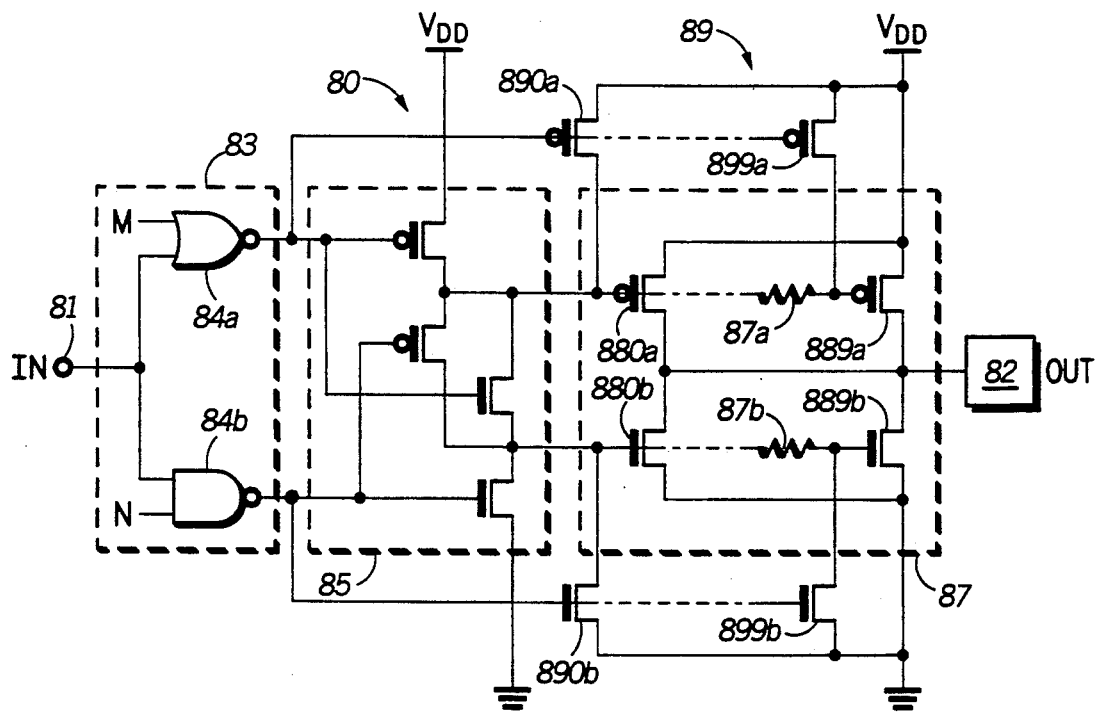
FIG. 8 is a schematic diagram of another embodiment of an output buffer circuit of this invention.

The output buffer circuit according to the present invention will now be described in detail with reference to preferred embodiments thereof, which are illustrated in FIGS. 7 and 8.

For convenience of explanation, certain transistor gates are specifically described as P-channel or N-channel. However, those of skill in the art will understand that theses are merely for ease of explanation and not intended to be limiting, and that the present invention includes arrangements where the channel types are inverted and/or where other combinations of P- and N-channels and voltage polarities are used. As is well understood, the FET devices of the circuit as well as other circuit components and their interconnections as illustrated may be fabricated as an integrated circuit in a single body of semiconductor material.

As shown in FIG. 7, an output buffer circuit 70 includes a data input terminal 71 for receiving a data input signal IN, an output signal terminal 72 for providing an output signal OUT, an input stage 73, a pre-driver stage 75, and an output driver stage 77. Input stage 73 comprises a NOR gate 74a and a NAND gate 74b. One input lead of NOR gate 74a and one input lead of NAND gate 74b are connected in common to receive the data input signal IN from input terminal 71. Other input leads of both gates 74a, b are used for receiving control or enable signals (not shown).

Pre-driver stage 75 comprises a first stacked pair of P-channel MOS FETs 76a and 76b, and a second stacked pair of N-channel MOS FETs 76c and 76d. P-channel transistors 76a and 76b are serially connected between a supply voltage $V_{DD}$ and a juncture of serially connected N-channel transistors 76c and 76d. N-channel Transistors 76c and 76d are serially connected between ground and a juncture of P-channel transistors 76a and 76b. The output of NOR gate 74a is connected to the gates of P-channel transistor 76a and N-channel transistor 76c. The output of NAND gate 74b is connected to the gate of P-channel transistor 76b and N-channel transistor 76d. A first output AA of pre-driver stage 75 is derived at a node between P-channel transistors 76a and 76b. A second output BB of pre-driver stage 75 is derived at a node between N-channel transistors 76c and 76d.

It should be noted that pre-driver stage 75 has the same number of transistors as buffer circuit 10 of FIGS. 1A and 1B. That is, implementation of pre-driver stage 75 can be accomplished by using the same number of transistors as in the known circuit but rewiring them as shown in FIG. 7.

Output driver stage 77 comprises a complementary pair of a P-channel MOS FET 78a and an N-channel MOS FET 78b. The MOS FETs 78a and 78b are connected in series between voltage supply $V_{DD}$ and ground. The gate of P-channel MOS FET 78a receives output AA from pre-driver stage 75. The gate of N-channel MOS FET 78b receives output BB from pre-driver stage 75. The output signal OUT is derived at a juncture of MOS FETs 78a and 78b.

In operation, when data input signal IN at input terminal 71 changes from logic low to high, the logic high signal is applied to a first input of NOR gate 74a thereby causing NOR gate 74a to generate a logic low signal at its output which is connected to the gates of transistors 76a and 76c. An enable signal M is at a logic low. Thus, P-channel transistor 76a turns on (conductive) and N-channel transistor 76c turns off (nonconductive), thus changing output AA to high immediately. High output AA is applied to the gate of P-channel transistor 78a, thus causing P-channel transistor 78a to turn off.

Simultaneously, the logic high input signal IN is applied also to a first input of NAND gate 74b with the other input lead receiving a logic high enable signal N, thereby causing NAND gate 74b to provide a logic low signal at its output which is connected to the gates of transistors 76b and 76d. Thus, P-channel transistor 76b turns on and N-channel transistor 76d turns off. Output BB becomes high at a delay period after output AA becomes high. This is because two stacked transistors 76a and 76b must turn on thereby providing output BB as a logic high while transistor 76a must turn on for output AA to be a logic high.

Therefore, N-channel transistor 78b does not become conductive until P-channel transistor 78a is completely nonconductive, thereby inhibiting overlap current. This delay period is determined by the sizes, especially the width-to length ratios (W/L), of transistors 76a, 76b; therefore it can be controlled.

Conversely, when data input signal IN at input terminal 71 changes from a logic high to low, the logic low signal is applied to the first input of NAND gate 74b thereby causing NAND gate 74b to generate a logic high signal at its output which is connected to the gates of transistors 76b and 76d. Thus, N-channel transistor 76d turns on and P-channel transistor 76b turns off, thereby changing output BB immediately to a logic low. Logic low output BB is applied to the gate of N-channel transistor 78b, thus causing N-channel transistor 78b to turn off.

Simultaneously, the logically low input signal IN is applied also to the first input of NOR gate 74a with the second input receiving a low enable signal M, thereby causing NOR gate 74a to generate a logic high signal on its output which is connected to the gates of transistors 76a and 76c. Thus, P-channel transistor 76a turns off and N-channel transistor 76c turns on. Output AA becomes low at a delay period after output BB becomes low. This is because two stacked or series-connected transistors 76c and 76d must turn on to provide a low output AA while only one transistor 76d must turn on for a low output BB.

Therefore, P-channel transistor 78a does not become conductive until N-channel transistor 78b is completely shut off, thereby inhibiting the overlap current. This delay period is determined by the transistor sizes, especially the width-to length ratios (W/L), 76c, 76d; therefore the delay can be controlled. That is, the transient period of transistor 78a does not overlap with the transient period of transistor 78b. Thus output buffer circuit 70 provides no or significantly reduced overlap current and less noise by turning off the active output transistor before turning on the opposing output transistor. By controlling the width-to length ratios (W/L) of transistors in pre-driver stage 75, the delay period can be very easily controlled. This pre-driver structure can be easily retrofit into existing output buffer designs.

FIG. 8 shows another embodiment according to the present invention. An output buffer circuit 80 includes a data input terminal 81 for receiving an input data signal IN, an output signal terminal 82 for providing an output signal OUT, an input stage 83, a pre-driver stage 85, and an output driver stage 87. The circuit structure of output buffer 80 of this embodiment is almost the same as that of the first embodiment buffer 70 shown in FIG. 7 except that output driver stage 87 includes a predetermined number of plural pairs of P-channel and N-channel MOS transistors 880a, b through 889a, b, as noted by the dashed lines. Output buffer 80 further comprises assist transistors 89.

In the illustrated form, assist transistors 89 include P-channel MOS FETs 890a through 899a, and N-channel MOS FETs 890b through 899b. P-channel transistor 899a, for example, is placed near the gate of corresponding P-channel transistor 889a to enhance the turn-off of transistor 889a. Other assist transistors 890 through 899 are placed near the gates of corresponding transistors 880 through 889. The gate of P-channel transistor 899a is connected to an output of NOR gate 84a, its source is connected to a positive supply voltage $V_{DD}$, and its drain is connected to the gate of transistor 889a.

It should be apparent from the previous discussion that significant impedance such as parasitic resistance 87a exists between the gate of transistor 880a and transistor 889a. This impedance causes overlap currents by slowing down the turn-off of the opposite drivers, as described above with reference to FIG. 3. Assist transistor 899a compensates the slowing down of the turn-off of opposite transistor 889a caused by the impedance, and facilitates the quick turn-off of transistor 889a. Other assist transistors may be similarly connected and function similarly. Assist transistors 890a, b through 899a, b are responsible for the turn-off direction only.

In this way, the combination of the stacked pre-driver transistors and the assist devices provide a faster and quieter output buffer circuit relative to what is conventionally used in CMOS applications. The output buffer circuit according to the invention provides great reduction in overlap current, RFI noise and power consumption.

While the present invention has been shown and described with reference to particular embodiments thereof, various modifications and changes thereto will be apparent to those skilled in the art and are within the spirit and scope of the present invention.

I claim:

1. An output buffer circuit having a data input terminal for receiving a data signal, and an output signal terminal for providing an output signal, comprising:
    an input stage for receiving the data signal from the data input terminal and for providing input stage outputs;
    a pre-driver stage for receiving the input stage outputs and for providing first and second outputs in response to the input stage outputs, said first output becoming logically low after a first predetermined controlled delay period after said second output becomes logically low, and said second output becoming logically high after a second predetermined controlled delay period after said first output becomes logically high; and
    an output driver stage for receiving said first and second outputs from the pre-driver stage and for providing the output signal to the output signal terminal, said output driver stage including at least one complementary pair of serially connected output transistor devices, and said output signal being derived at a node between said serially connected output transistor devices,
    said first and second outputs of the pre-driver stage being supplied only to said output driver stage and not to said input stage.

2. An output buffer circuit according to claim 1 wherein said input stage comprises a first logic gate and a second logic gate each having at least one input and an output, said inputs of the first and second logic gates being connected together for receiving the data signal.

3. An output buffer circuit according to claim 1 wherein said pre-driver stage comprises:
    a first pair of transistors being serially connected between a first supply voltage terminal and said second output of the pre-driver stage, a node between said first pair of transistors being connected to said first output of the pre-driver stage; and a second pair of transistors being serially connected between said first output of the pre-driver stage and a second supply voltage terminal, a node between said second pair of transistors being connected to said second output of the pre-driver stage.

4. An output buffer circuit according to claim 3 wherein control electrodes of said first and second pairs of transistors are connected to the input stage outputs.

5. An output buffer circuit according to claim 4 wherein said first pair of transistors are MOS transistors of a first conductivity, and said second pair of transistors are MOS transistors of a second conductivity.

6. An output buffer circuit according to claim 5 wherein said first conductivity is a p-type conductivity, and said second conductivity is an n-conductivity.

7. An output buffer circuit according to claim 3 wherein:
   said first predetermined controlled delay period is determined by width-to-length ratios (W/L) of said second pair of transistors; and
   said second predetermined controlled delay period is determined by width-to-length ratios (W/L) of said first pair of transistors.

8. An output buffer circuit according to claim 1 wherein:
   said at least one complementary pair of output transistor devices comprises a p-channel MOS transistor and an n-channel MOS transistor.

9. An output buffer circuit according to claim 8 wherein:
   a source of said p-channel MOS transistor is connected to a first supply voltage terminal;
   a gate of said p-channel MOS transistor receives said first output from the pre-driver stage;
   drain electrodes of both of said p-channel and n-channel MOS transistors are connected together for providing the output signal;
   a gate of said n-channel MOS transistor receives the second output from the pre-driver stage; and
   a source of said n-channel transistor is connected to a second supply voltage terminal.

10. An output buffer circuit having a data input terminal for receiving a data signal, and an output signal terminal for providing an output signal, comprising:
    an input stage for receiving the data signal from the data input terminal and for providing input stage outputs;
    a pre-driver stage for receiving the input stage outputs and for providing first and second outputs in response to the input stage outputs, said first output becoming logically low at a first predetermined controlled delay period after said second output becomes logically low, and said second output becoming logically high at a second predetermined controlled delay period after said first output becomes logically high;
    an output driver stage including a plurality of complementary pairs of serially connected p- and n-channel MOS transistors, said plurality of pairs being connected in parallel between first and second supply voltage terminals, control electrodes of said p-channel transistors receiving said first output from the pre-driver stage, control electrodes of said n-channel transistors receiving said second output from the pre-driver stage, and all nodes between said MOS transistors in said pairs being connected together for providing the output signal to the output signal terminal; and
    assist means for receiving the input stage outputs and for assisting said MOS transistors in turning off,
    said first and second outputs of the pre-driver stage being supplied only to said output driver stage and not to said input stage.

11. An output buffer circuit according to claim 10 wherein:
    said input stage comprises a first logic gate and a second logic gate each having at least one input and an output, said inputs of the first and second logic gates being connected in common for receiving the data signal.

12. An output buffer circuit according to claim 10 wherein said pre-driver stage comprises:
    a first pair of transistors being serially connected between a first voltage supply and said second output of the pre-driver stage, a node between said first pair of transistors being connected to said first output of the pre-driver stage; and
    a second pair of transistors being serially connected between said first output of the pre-driver stage and a second voltage supply, a node between said second pair of transistors being connected to said second output of the pre-driver stage.

13. An output buffer circuit according to claim 12 wherein:
    said assist means further comprise MOS transistors having gates connected to the input stage outputs, said assist means supplying signals for turning off the MOS transistors in the output driver stage.

14. An output buffer circuit according to claim 12 wherein:
    said first predetermined controlled delay period is determined by width-to-length ratios (W/L) of said second pair of transistors; and
    said second predetermined controlled delay period is determined by width-to-length ratios (W/L) of said first pair of transistors.

* * * * *